United States Patent
Otsuka et al.

(10) Patent No.: US 6,731,153 B2
(45) Date of Patent: May 4, 2004

(54) SEMICONDUCTOR INTEGRATED CIRCUIT HAVING SWITCHING TRANSISTORS AND VARACTORS

(75) Inventors: Kanji Otsuka, Higashiyamoto (JP); Tamotsu Usami, Kokubunji (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/963,500

(22) Filed: Sep. 27, 2001

(65) Prior Publication Data

US 2002/0044012 A1 Apr. 18, 2002

(30) Foreign Application Priority Data

Oct. 16, 2000 (JP) .......................... 2000-315360

(51) Int. Cl.[7] .............................................. H03K 17/04
(52) U.S. Cl. .................. 327/374; 327/112; 327/586; 326/17; 326/26; 326/83
(58) Field of Search ................ 327/586, 565, 327/566, 374–377, 378, 392–394, 382, 111, 112; 326/17–20, 26–27, 82–92, 102

(56) References Cited

U.S. PATENT DOCUMENTS

| | | | | |
|---|---|---|---|---|
| 3,573,683 A | * | 4/1971 | Marshall et al. | 334/15 |
| 4,209,713 A | * | 6/1980 | Satou et al. | 327/310 |
| 4,499,387 A | * | 2/1985 | Konishi | 326/102 |
| 5,644,266 A | * | 7/1997 | Chen et al. | 326/108 |
| 5,748,016 A | * | 5/1998 | Kurosawa | 326/27 |
| 6,144,217 A | | 11/2000 | Iwata et al. | 326/27 |
| 6,429,684 B1 | * | 8/2002 | Houston | 326/81 |

FOREIGN PATENT DOCUMENTS

| | | |
|---|---|---|
| JP | 2000-36561 A | 2/2000 |
| JP | 2000-196018 | 7/2000 |
| KR | 1991-1916 A | 1/1991 |

OTHER PUBLICATIONS

Tsung–Hsien Lin et al., "A 900–MHz 2.5–mA CMOS Frequency Synthesizer with an Automatic SC Tuning Loop", IEEE Journal of Solid–State Circuits, vol. 36, No. 3, pp. 424–431, Mar. 2001.

Vincent von Kaenel et al., "A 320 MHz, 1.5 mW @ 1.35 V CMOS PLL for Microprocessor Clock Generation", IEEE Journal of Solid–State Circuits, vol. 31, No. 11, pp. 1715–1722, Nov. 1996.

* cited by examiner

Primary Examiner—Minh Nguyen
(74) Attorney, Agent, or Firm—Nixon Peabody LLP; Donald P. Studebaker

(57) ABSTRACT

A CMOS line driver is made up of p- and nMOS transistors. A pMOS varactor is interposed between the source of the pMOS transistor and a power supply, while an nMOS varactor is interposed between the source of the nMOS transistor and ground. The sizes of each of these MOS varactors may be the same as those of the p- or nMOS transistor. Alternatively, each of these MOS varactors may have a channel area twice greater than that of the p- or nMOS transistor. The inverted version of a signal input to the line driver is supplied to the gates of the MOS varactors. In this manner, the MOS transistors, making up the line driver, can switch at a high speed.

8 Claims, 11 Drawing Sheets

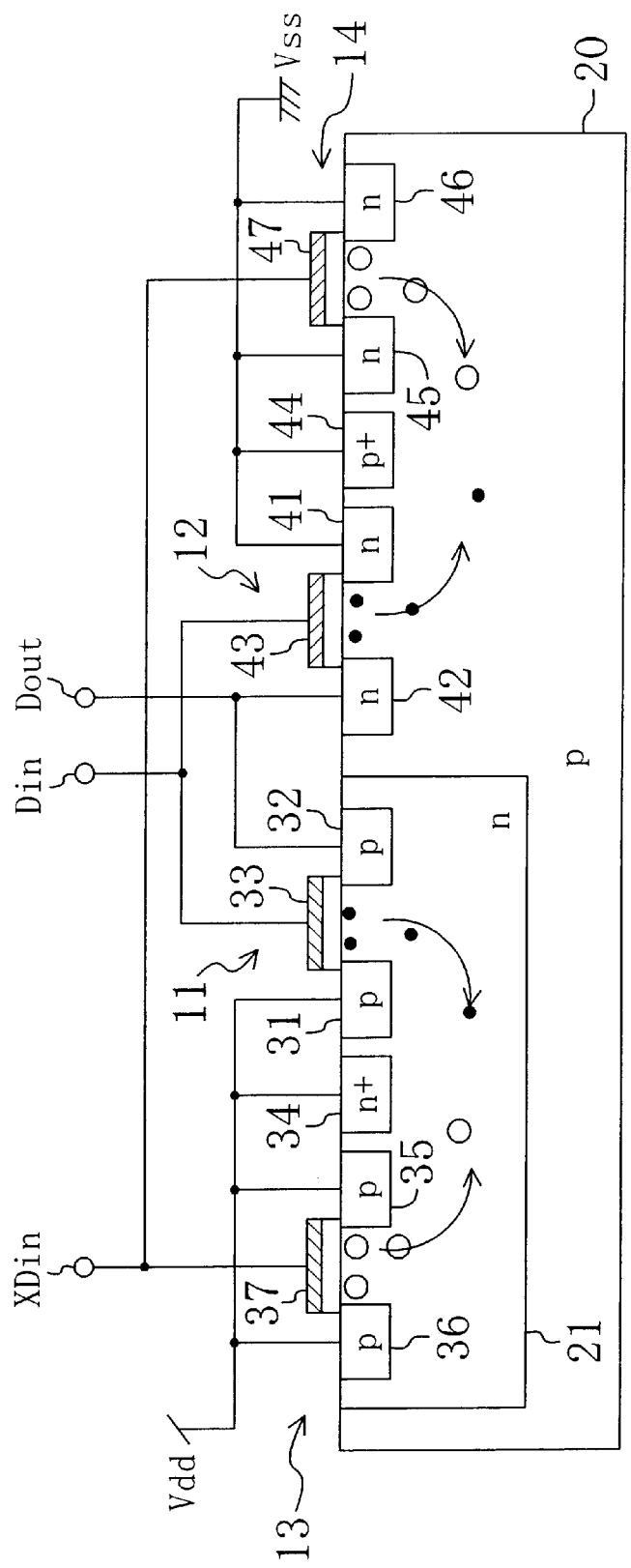

SEMICONDUCTOR INTEGRATED CIRCUIT HAVING SWITCHING TRANSISTORS AND VARACTORS

BACKGROUND OF THE INVENTION

The present invention relates to a semiconductor integrated circuit and more particularly relates to a technique of switching transistors in a digital circuit at a high speed.

In a digital semiconductor integrated circuit, a transistor is equivalent to a switch that turns ON or OFF in response to a signal. To change the ON/OFF states of a transistor, it is necessary to release the charges that have been stored on a parasitic capacitance of the transistor or to supply charges to the transistor. However, it usually takes a rather long time for those charges to reach their destinations because various obstructions exist on the path of the charges. Among other things, a parasitic inductance associated with a power line very likely prevents charges from being supplied from a power supply to the transistor instantaneously. Accordingly, to reduce that parasitic inductance, an IC chip of today often includes bypass capacitors.

In applications handling a signal with a frequency on the order of several gigahertz, however, even those additional bypass capacitors cannot cope with the demand of storing charges in a transistor rapidly enough. That is to say, the charge supplying ability of a power supply system determines the frequency characteristic of an overall chip. More specifically, an instantaneous rise in current either decreases the supply voltage or increases the ground level unintentionally, thus limiting the amount of instantaneous current flowing.

SUMMARY OF THE INVENTION

It is therefore an object of the present invention to switch a transistor at a high speed by providing a circuit for pumping charges up or down compulsorily in the quantity required for turning the transistor ON or OFF.

To achieve this object, the present invention utilizes an active variable-capacitance device. Then, not just charges can be pumped up or down intentionally but also charges stored in a transistor are recyclable as well.

Specifically, an inventive semiconductor integrated circuit includes a switching device and a varactor device. The switching device has been formed on a semiconductor substrate to turn ON or OFF in response to a signal. The varactor device has a capacitance varying with a voltage level of the signal. The varactor device has been formed on the semiconductor substrate to help the switching device change its states at a high speed by exchanging charges with the switching device when the signal rises or falls.

To realize the charge exchange highly efficiently, the varactor device may be formed adjacently to the switching device. In one embodiment of the present invention, a variation in capacitance of the varactor device is preferably once to twice greater than a variation in capacitance of the switching device. In still another embodiment, the varactor device may be provided selectively either for a section that should realize high-speed signal transmission for the switching device or for an input/output circuit for the switching device.

The present invention utilizes a varactor device that can help a switching device change its states at a high speed by exchanging charges with the switching device when a signal rises or falls. Thus, the present invention realizes a semiconductor integrated circuit that can afford to handle even a signal with as high a frequency as 100 GHz.

BRIEF DESCRIPTION OF THE DRAWINGS

FIG. 2 is a cross-sectional view of the circuit shown in FIG. 1.

DETAILED DESCRIPTION OF THE INVENTION

Hereinafter, applications of the present invention to a line driver requiring high-speed signal transmission will be described with reference to the accompanying drawings.

Figure 1:
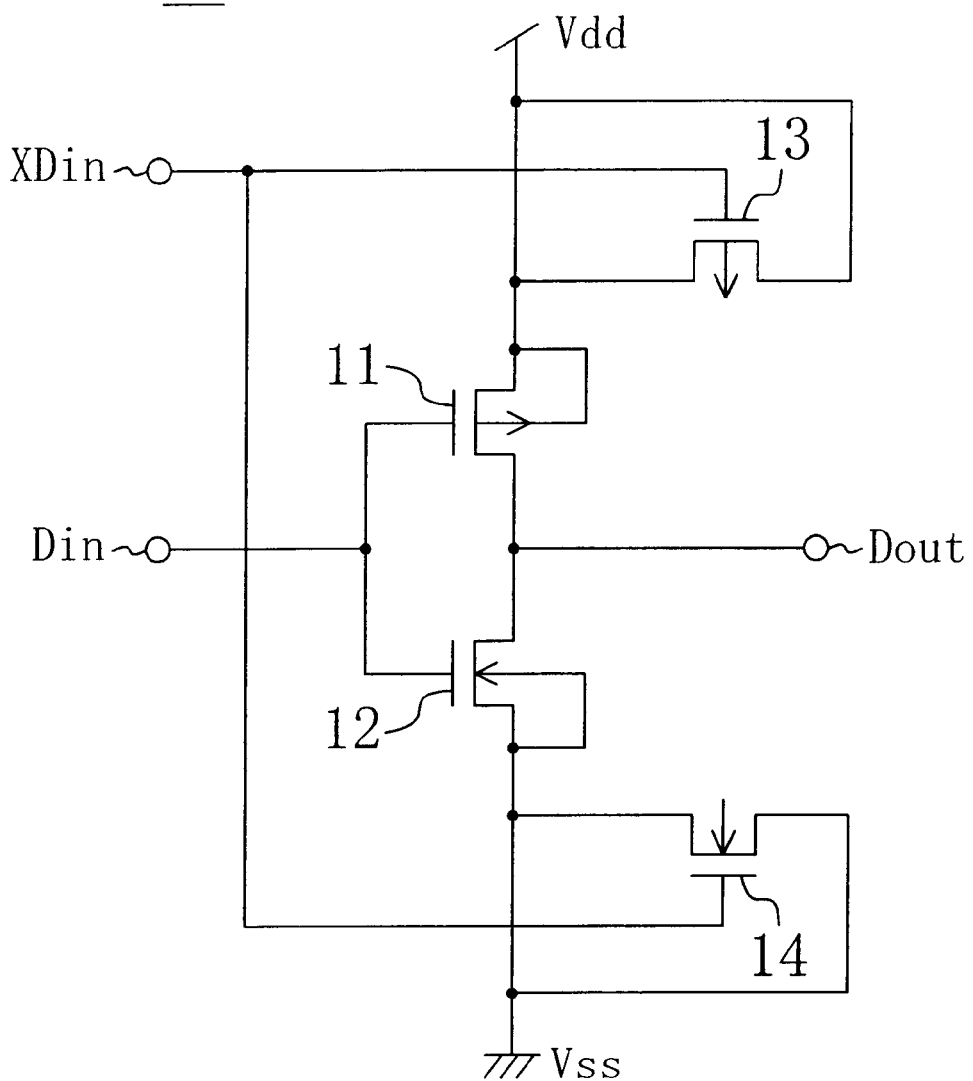
FIG. 1 is a circuit diagram illustrating a first basic configuration for an inventive semiconductor integrated circuit.

FIG. 1 illustrates a first basic configuration for an inventive semiconductor integrated circuit. As shown in FIG. 1, a p-channel MOS (pMOS) transistor 11 and an n-channel MOS (nMOS) transistor 12 together makes up a CMOS line driver 10 that receives a signal Din and outputs a signal Dout. A p-channel MOS (pMOS) varactor 13 is interposed between the source of the pMOS transistor 11 and power supply Vdd, while an n-channel MOS (nMOS) varactor 14 is interposed between the source of the nMOS transistor 12 and ground Vss. The sizes of the pMOS varactor 13 may be the same as those of the pMOS transistor 11. Alternatively, the channel area of the pMOS varactor 13 may be twice greater than that of the pMOS transistor 11. The sizes of the nMOS varactor 14 may be the same as those of the nMOS transistor 12. Alternatively, the channel area of the nMOS varactor 14 may be twice greater than that of the nMOS transistor 12. A signal XDin, which is the inverted version of the Din signal, is supplied to the gates of the p- and nMOS varactors 13 and 14.

FIG. 2 illustrates a cross-sectional structure of the circuit shown in FIG. 1. As shown in FIG. 2, the pMOS transistor 11 and pMOS varactor 13 are formed to be horizontally adjacent to each other on respective parts of an n-well 21 in a p-type semiconductor substrate (which will be herein referred to as a "p-substrate") 20. On the other hand, the nMOS transistor 12 and nMOS varactor 14 are formed to be horizontally adjacent to each other on respective parts of the p-substrate 20. More specifically, the pMOS transistor 11 includes: source 31 connected to Vdd; drain 32 connected to Dout; gate 33 connected to Din; and base 34 for fixing the potential level in the n-well 21 at Vdd. The pMOS varactor 13 includes: source and drain 35 and 36 connected to Vdd; and gate 37 connected to XDin. The nMOS transistor 12 includes: source 41 connected to Vss; drain 42 connected to Dout; gate 43 connected to Din; and base 44 for fixing the potential level in the p-substrate 20 at Vss. The nMOS varactor 14 includes: source and drain 45 and 46 connected to Vss; and gate 47 connected to XDin.

Figure 3A:
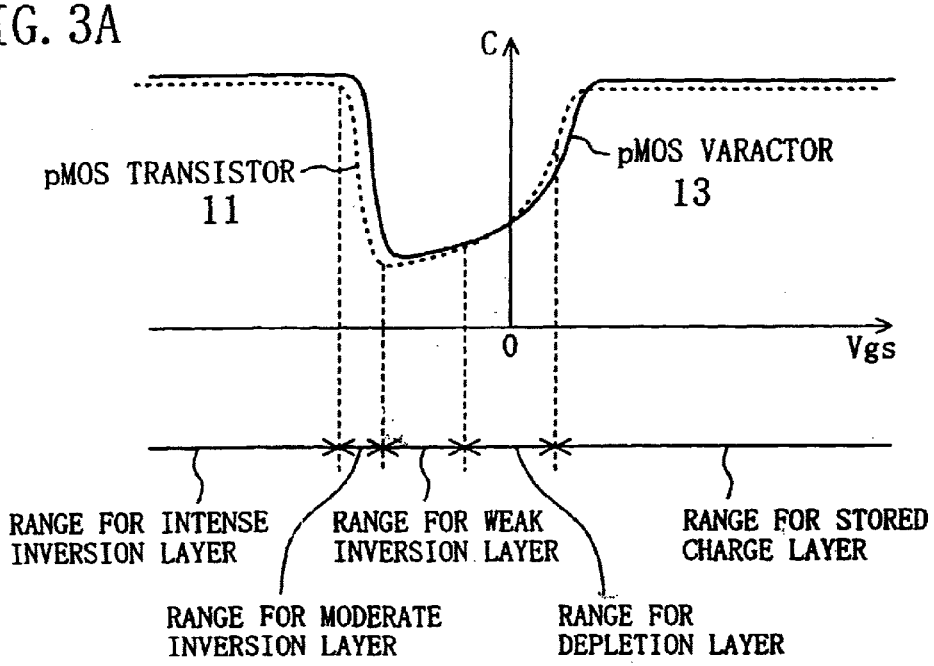
FIGS. 3A and 3B are graphs illustrating the capacitance-voltage characteristics of the devices shown in FIG. 1.
Figure 3B:
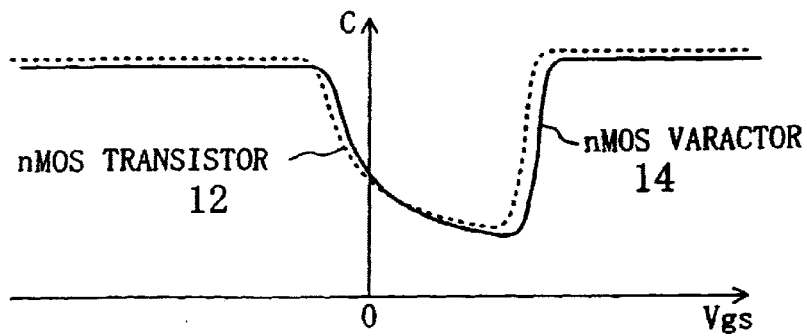

FIGS. 3A and 3B illustrate the capacitance-voltage characteristics of the devices 11 through 14 shown in FIG. 1. Hereinafter, the capacitance-voltage characteristic of the pMOS transistor 11 will be described in detail with reference to FIG. 3A.

The capacitance C of the pMOS transistor 11 varies with the gate-source voltage Vgs thereof. This variation is classifiable into the five ranges where intense inversion layer, moderate inversion layer, weak inversion layer, depletion layer and stored charge layer dominate, respectively. First, when a negative potential is applied to the gate of the pMOS transistor 11, the channel of the pMOS transistor 11 right under the gate insulating film thereof has its conductivity type inverted. As a result, an inversion layer is formed in the channel of the pMOS transistor 11. In that case, charges are stored between the gate potential and the potential level of the inversion layer, thereby producing a capacitance Cox there. It should be noted that the charges existing in the inversion layer are holes in that situation. A depletion layer further exists under the inversion layer, and positive and negative charges face each other with the depletion layer interposed therebetween, thus producing another capacitance Ci there. A third capacitance Cb is further produced by a potential distribution that has been formed due to the existence of the inversion layer in the n-well 21. That is to say, the capacitance C of the pMOS transistor 11 herein means the sum of these capacitances Cox, Ci and Cb. However, Cox is dominating at this point in time. As the gate potential rises, this state declines little by little and the charges are distributed more and more broadly. That is to say, the capacitance C decreases. When the inversion layer no longer exists (i.e., when only the depletion layer exists there), the charge quantity reaches its minimum value. If the gate potential is further raised after that, then an increasing quantity of charges will be stored. In the illustrated example, electrons will be stored in the layer right under the gate insulating film. Naturally, the quantity of electrons stored in that layer is equal to the quantity of holes that have been stored in the inversion layer. As a result, the capacitance C increases again up to Cox. The Cox value is given by $$Cox = \epsilon ox \cdot S/tox$$

where $\epsilon ox$ is the dielectric constant of the gate insulating film, S is the channel area and tox is the thickness of the gate insulating film. Supposing the minimum value of the capacitance C is Cmin, a charge quantity Qtran=2Vswing (Cox−Cmin) should be injected from the power supply when the gate voltage changes by Vswing as a result of logical level inversion. In this case, the coefficient of 2 is necessary to reverse the charges. The charge quantity Qtran may be regarded as having nothing to do with the output charges of the pMOS transistor 11 and as energy needed for activating the pMOS transistor 11.

Suppose Vswing=0.5 V, Cox=5 fF, Cmin=2.5 fF and the transition time (i.e., rise or fall time) of the signal Din input to the gate is 25 ps. Then, Qtran=1.25 fC and an additional current Itran of 50 $\mu$A should flow for 25 ps to drive the pMOS transistor 11. That is to say, this energy should be absorbed or released every time the signal rises or falls. The same statement is applicable to the nMOS transistor 12.

Referring to FIG. 3A, as the gate potential changes in the negative direction (i.e., Din is falling), the pMOS transistor 11 releases an increasing quantity of electrons that have been stored right under the gate, thereby forming a depletion layer. At this point in time, no channel has been formed yet for the pMOS transistor 11. Accordingly, the charges (i.e., electrons in this case) that have been stored in the channel region diffuse deeper into the n-well 21 as shown in FIG. 2. As a result, the potential level in the n-well 21 becomes lower than Vdd. On the other hand, the pMOS varactor 13, which has received XDin (i.e., the inverted version of the Din signal) at its gate, is on the point of releasing holes into the n-well 21 as shown in FIG. 2. Consequently, those electrons and holes meet and combine together. Thereafter, on and after an inversion layer has been formed in the channel of the pMOS transistor 11, the capacitance C will go on increasing and will need a greater and greater quantity of holes. In the meantime, XDin, which is being input to the gate of the pMOS varactor 13, is changing in the positive direction and the pMOS varactor 13 is absorbing the electrons. In this manner, electron-hole pairs are newly created in the n-well 21, so this variation in potential distribution can be canceled. That is to say, the quantity of charges stored is controllable just by changing the potential balance in the n-well 21. As a result, not just the demand for high-speed signal transmission can be coped with, but also the stored charges, which have been dissipated for nothing in known structures, are advantageously recyclable as well. It should be noted that the release of charges cannot be completely timed with the absorption of charges because the minimum capacitance C of the pMOS transistor 11 shifts in the negative direction as shown in FIG. 3A. However, this time lag accounts for just a part of the signal transition time and is almost negligible. Totally opposite statement is applicable to the other situation where Din is rising, and the description thereof will be omitted herein.

A similar phenomenon is also observable in part of the p-substrate 20 between the nMOS transistor 12 and nMOS varactor 14 as shown in FIGS. 2 and 3B.

As described above, the circuit shown in FIG. 1 includes the pMOS varactor 13 for the pMOS transistor 11 that turns ON or OFF in response to the Din signal. When the Din signal rises or falls, the pMOS varactor 13 exchanges charges with the pMOS transistor 11, thereby helping the pMOS transistor 11 change its states at a high speed. The circuit shown in FIG. 1 further includes the nMOS varactor 14 for the nMOS transistor 12 that turns ON or OFF in response to the Din signal. When the Din signal rises or falls, the nMOS varactor 14 exchanges charges with the nMOS transistor 12, thereby helping the nMOS transistor 12 change its states at a high speed.

Figure 4:
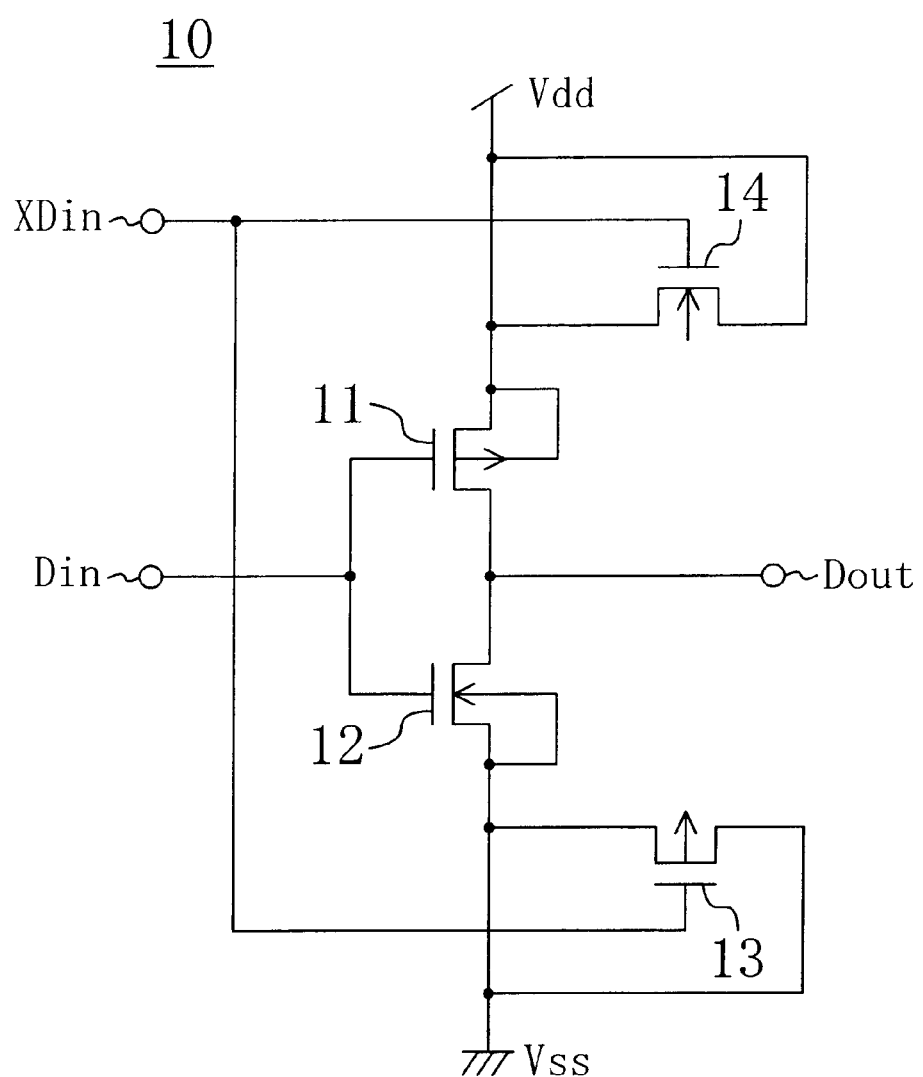
FIG. 4 is a circuit diagram illustrating a second basic configuration for the inventive semiconductor integrated circuit.

FIG. 4 illustrates a second basic configuration for the inventive semiconductor integrated circuit. As shown in FIG. 4, a pMOS transistor 11 and an nMOS transistor 12 together makes up a CMOS line driver 10 that receives a signal Din and outputs a signal Dout. An nMOS varactor 14 is interposed between the source of the pMOS transistor 11 and power supply Vdd, while a pMOS varactor 13 is interposed between the source of the nMOS transistor 12 and ground Vss. A signal XDin, which is the inverted version of the Din signal, is supplied to the gates of the p- and nMOS varactors 13 and 14.

Figure 5:
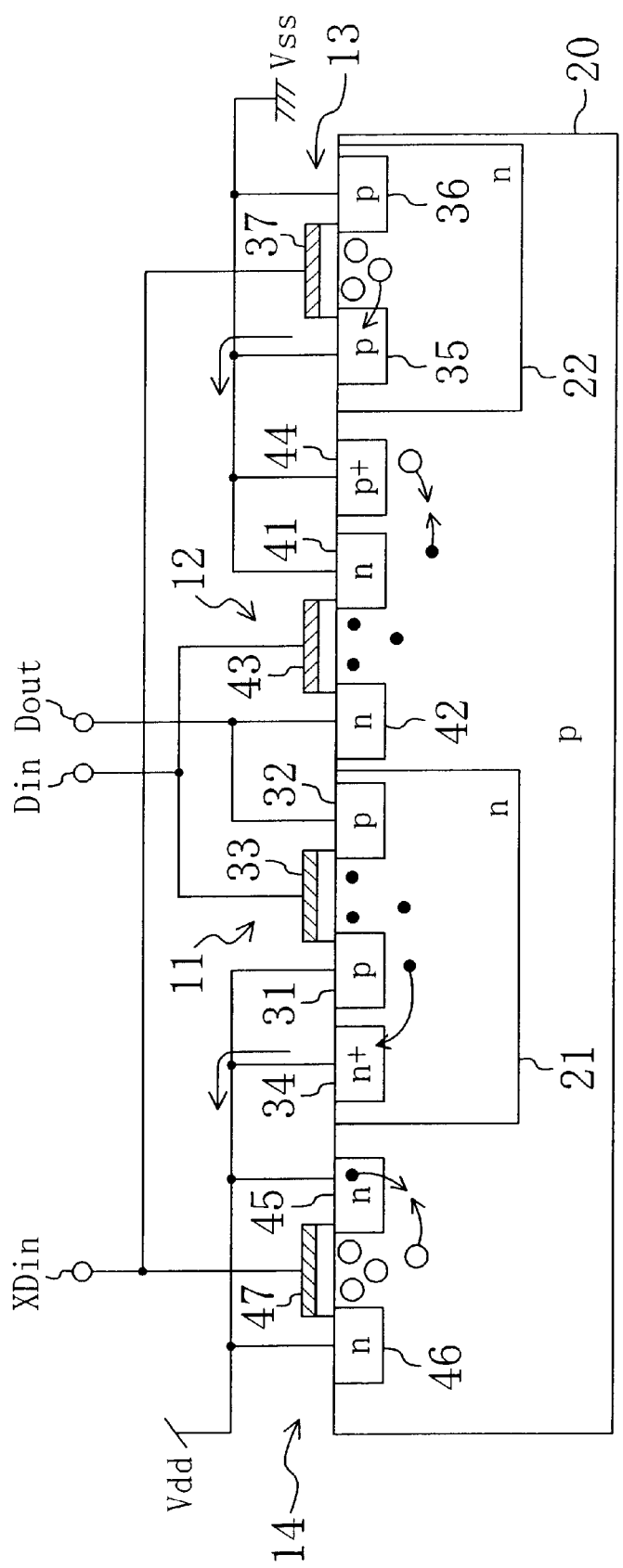
FIG. 5 is a cross-sectional view of the circuit shown in FIG. 4.

FIG. 5 illustrates a cross-sectional structure of the circuit shown in FIG. 4. As shown in FIG. 5, the pMOS transistor 11 has been formed over an n-well 21 of a p-substrate 20 so as to be adjacent to the nMOS varactor 14. On the other hand, the nMOS transistor 12 has been formed so as to be adjacent to the pMOS varactor 13 located over another n-well 22 of the p-substrate 20.

Figure 6A:
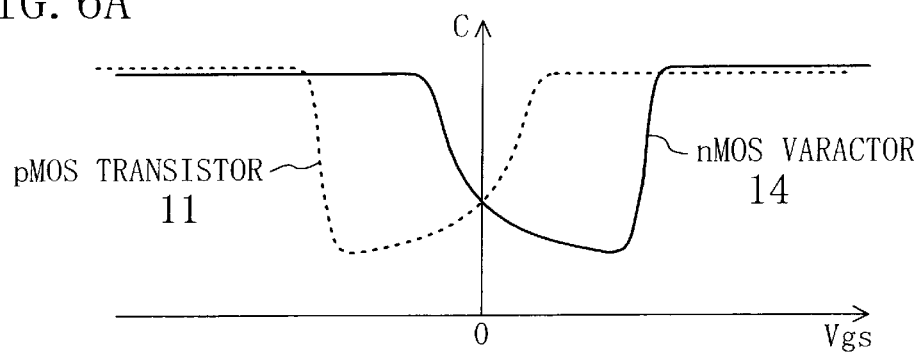
FIGS. 6A and 6B are graphs illustrating the capacitance-voltage characteristics of the devices shown in FIG. 4.
Figure 6B:
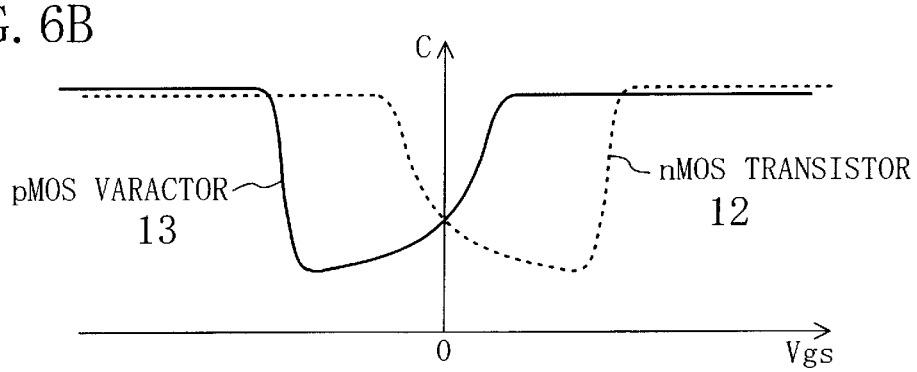

FIGS. 6A and 6B illustrate the capacitance-voltage characteristics of the devices 11 through 14 shown in FIG. 4.

Referring to FIG. 6A, as the gate potential changes in the negative direction (i.e., Din is falling), the pMOS transistor 11 releases an increasing quantity of stored electrons into the n-well 21. These electrons will be supplied to the nMOS varactor 14 by way of the contact electrode of the base 34. On the other hand, the nMOS varactor 14 releases holes into the p-substrate 20 at the same time in response to the XDin signal. Those electrons and holes cancel each other at the pn junction formed between the source 45 of the nMOS varactor 14 and the p-substrate 20, because the pMOS transistor 11 and nMOS varactor 14 are located close to each other. Thereafter, on and after an inversion layer has been formed as a result of the drop in gate potential of the pMOS transistor 11, an increasing quantity of holes will be needed. At that time, the nMOS varactor 14 will still be releasing holes. Consequently, the holes, released from the nMOS varactor 14, will be injected into the channel region of the pMOS transistor 11 by way of the same route. This phenomenon is a so-called "pump-up" injection. A similar phenomenon is observable between the nMOS transistor 12 and pMOS varactor 13 as shown in FIGS. 5 and 6B.

As described above, the circuit shown in FIG. 4 includes the nMOS varactor 14 for the pMOS transistor 11 that turns ON or OFF in response to the Din signal. When the Din signal rises or falls, the nMOS varactor 14 exchanges charges with the pMOS transistor 11, thereby helping the pMOS transistor 11 change its states at a high speed. The circuit shown in FIG. 4 further includes the pMOS varactor 13 for the nMOS transistor 12 that turns ON or OFF in response to the Din signal. When the Din signal rises or falls, the pMOS varactor 13 exchanges charges with the nMOS transistor 12, thereby helping the nMOS transistor 12 change its states at a high speed.

In the foregoing examples, the MOS varactors 13 and 14 are enhancement-mode devices. Alternatively, any of various other MOS transistor/MOS varactor combinations is possible in the present invention so long as the inverted signal XDin is used. For example, a depletion-mode nMOS varactor 14 may be combined with the pMOS transistor 11 while a depletion-mode pMOS varactor 13 may be combined with the nMOS transistor 12. As another alternative, to take advantage of the high-speed response of n-channel devices, the pMOS transistor 11 may be combined with a depletion-mode nMOS varactor while the nMOS transistor 12 may be combined with an enhancement-mode nMOS varactor.

Figure 6C:
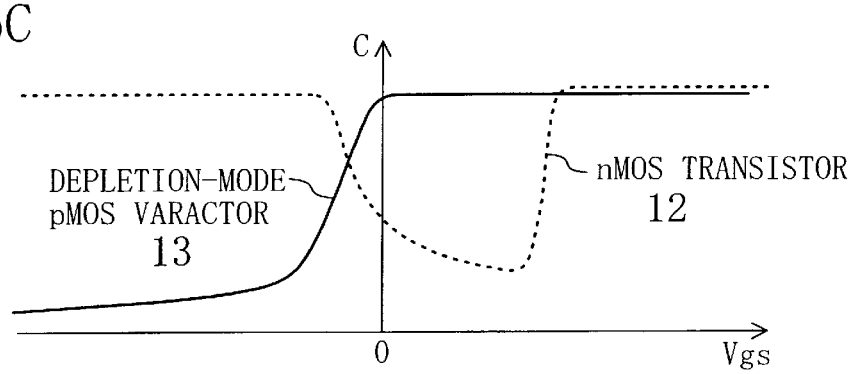
FIG. 6C is a graph illustrating another capacitance-voltage characteristic of the p-channel MOS varactor shown in FIG. 4.

FIG. 6C illustrates a situation where a depletion-mode pMOS varactor 13 is combined with the nMOS transistor 12. In the example illustrated in FIG. 6C, the timing of pump-up or pump-down is controllable arbitrarily by adopting the depletion-mode pMOS varactor 13. In this case, however, the charges forming a channel are not the stored charges, i.e., not electrically neutral themselves. Accordingly, as shown in FIG. 6C, the capacitance in this part is small. For that reason, even if the charges stored under the gate of the nMOS transistor 12 diffuse deeper into the p-substrate 20, the resultant potential variation cannot be compensated for. In many cases, however, the quantity of charges when the inversion layer is formed is the greater. Thus, the charges can also be pumped up or down by way of the inversion layer even with this structure. Also, if the capacitance of the pMOS varactor 13 is set a little greater, then the overall variation in charge quantity can be compensated for.

Figure 7:
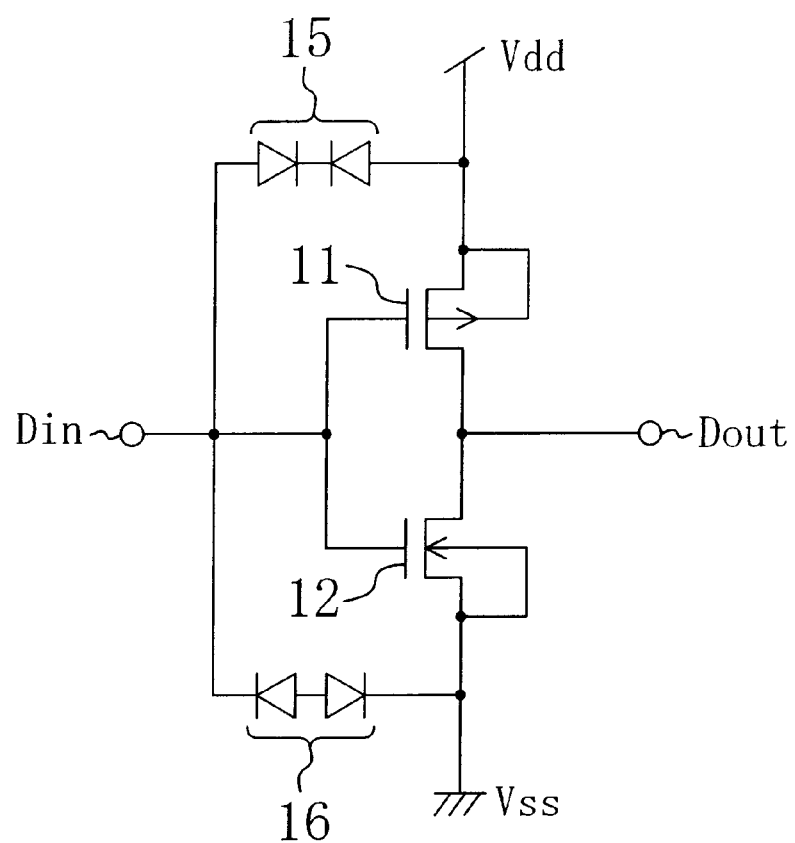
FIG. 7 is a circuit diagram illustrating a third basic configuration for the inventive semiconductor integrated circuit.

FIG. 7 illustrates a third basic configuration for the inventive semiconductor integrated circuit. As shown in FIG. 7, a pMOS transistor 11 and an nMOS transistor 12 together makes up a CMOS line driver 10 that receives a signal Din and outputs a signal Dout. A first pn junction varactor 15 is interposed between the source of the pMOS transistor 11 and Din, while a second pn junction varactor 16 is interposed between the source of the nMOS transistor 12 and Din. The variation in capacitance of the pn junction varactors 15 and 16 is set once to twice greater than the variation in capacitance of the p- and nMOS transistors 11 and 12.

Figure 8:
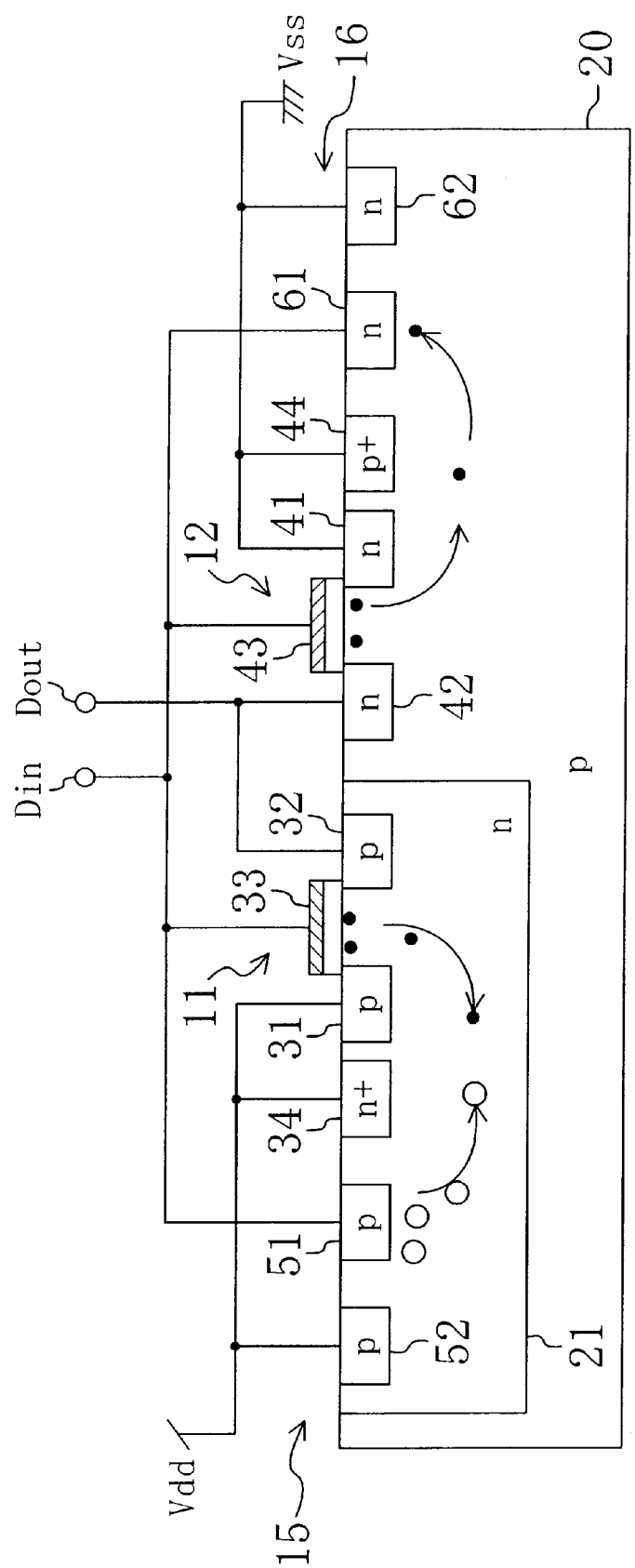
FIG. 8 is a cross-sectional view of the circuit shown in FIG. 7.

FIG. 8 illustrates a cross-sectional structure of the circuit shown in FIG. 7. As shown in FIG. 8, the pMOS transistor 11 and first pn junction varactor 15 are formed to be horizontally adjacent to each other over an n-well 21. On the other hand, the nMOS transistor 12 and second pn junction varactor 16 are formed to be horizontally adjacent to each other over part of a p-substrate 20. More specifically, the first pn junction varactor 15 includes: p-type region 51 connected to Din; n-type region that forms part of the n-well 21; and p-type region 52 connected to Vdd. The second pn junction varactor 16 includes: n-type region 61 connected to Din; p-type region that forms part of the p-substrate 20; and n-type region 62 connected to Vss.

Figure 9:
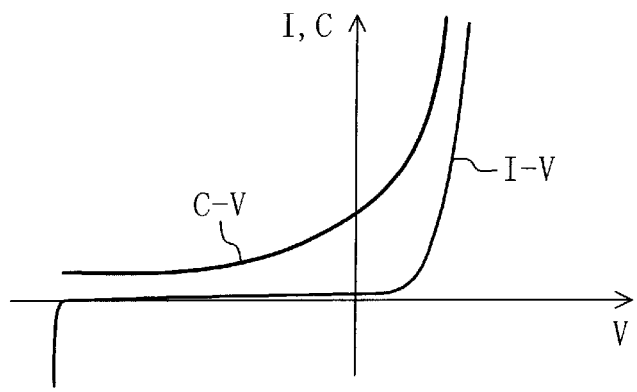
FIG. 9 is a graph illustrating the current-voltage and capacitance-voltage characteristics of the varactor diodes shown in FIG. 7.

FIG. 9 illustrates the current-voltage and capacitance-voltage characteristics of the varactor diodes shown in FIG. 7. As is well known in the art, as the depth of the depletion layer in a pn junction changes with the voltage V applied to the depletion layer, the junction capacitance C thereof changes as shown in FIG. 9. That is to say, the circuit shown in FIG. 7 utilizes this relationship and needs no inverted signal XDin.

In the example illustrated in FIG. 8, as the Din signal falls, the pMOS transistor 11 releases an increasing quantity of electrons. In the first pn junction varactor 15, the p-type region 51, to which the Din signal is also input, tends to make the depletion layer broader, thus releasing holes that have been captured therein. As a result, these charges cancel each other in the n-well 21, thus helping the pMOS transistor 11 change its states quickly. On the other hand, while the nMOS transistor 12 is releasing electrons, the n-type region 61, to which Din is input, makes the depletion layer shallower (i.e., increases its capacitance) in the second pn junction varactor 16. Thus, the n-type region 61 captures the electrons released. Totally opposite statement is applicable to the situation where Din is rising, and the description thereof will be omitted herein.

As described above, the circuit shown in FIG. 7 includes the pn junction varactor 15 for the pMOS transistor 11 that turns ON or OFF in response to the Din signal. When the Din signal rises or falls, the pn junction varactor 15 exchanges charges with the pMOS transistor 11, thereby helping the pMOS transistor 11 change its states at a high speed. The circuit shown in FIG. 7 further includes the pn junction varactor 16 for the nMOS transistor 12 that turns ON or OFF in response to the Din signal. When the Din signal rises or falls, the pn junction varactor 16 exchanges charges with the nMOS transistor 12, thereby helping the nMOS transistor 12 change its states at a high speed.

Figure 10:
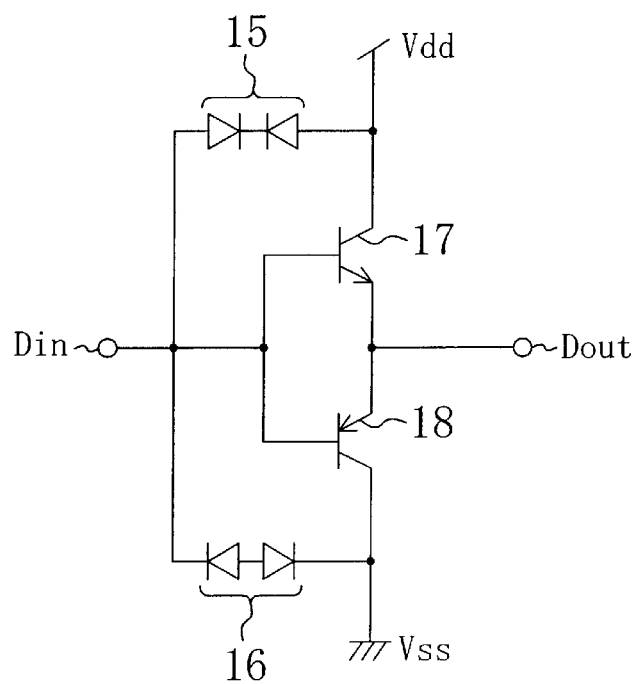
FIG. 10 is a circuit diagram illustrating a fourth basic configuration for the inventive semiconductor integrated circuit.

FIG. 10 illustrates a fourth basic configuration for the inventive semiconductor integrated circuit. As shown in FIG. 10, an npn transistor 17 and a pnp transistor 18 together makes up a complementary line driver 10 that receives a signal Din and outputs a signal Dout. A first pn junction varactor 15 is interposed between the collector of the npn transistor 17 and Din, while a second pn junction varactor 16 is interposed between the collector of the pnp transistor 18 and Din. The variation in capacitance of the pn junction varactors 15 and 16 is set once to twice greater than the variation in capacitance of these bipolar transistors 17 and 18.

Figure 11:
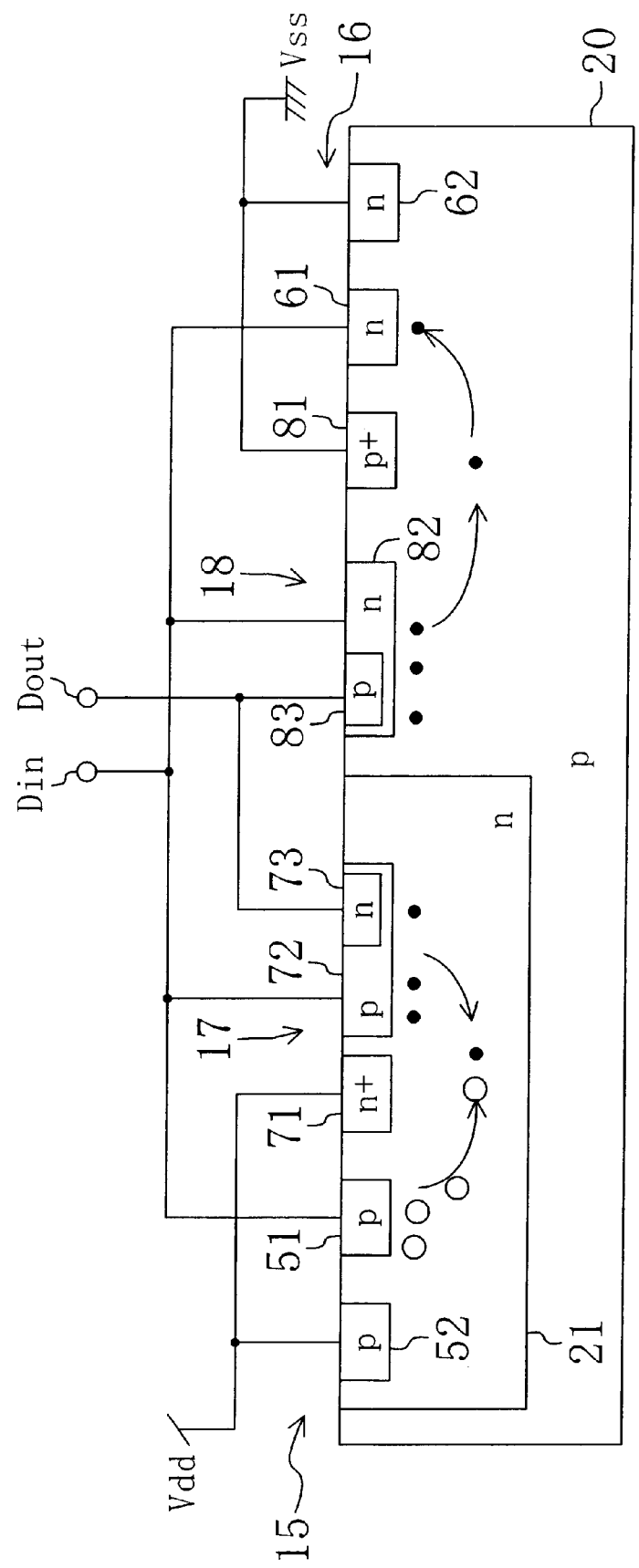
FIG. 11 is a cross-sectional view of the circuit shown in FIG. 10.

FIG. 11 illustrates a cross-sectional structure of the circuit shown in FIG. 10. As shown in FIG. 11, the npn transistor 17 and first pn junction varactor 15 are formed to be horizontally adjacent to each other over an n-well 21. On the other hand, the pnp transistor 18 and second pn junction varactor 16 are formed to be horizontally adjacent to each other over part of a p-substrate 20. More specifically, the npn transistor 17 includes: collector 71 connected to Vdd; base 72 connected to Din; and emitter 73 connected to Dout. The pnp transistor 18 includes: collector 81 connected to Vss; base 82 connected to Din; and emitter 83 connected to Dout.

Each of the first and second pn junction varactors 15 and 16 operates in accordance with the quantity of charges stored between the base and collector of the associated bipolar transistor 17 or 18. The base-collector capacitance is the greatest in each of these bipolar transistors 17 and 18. That is to say, the circuit shown in FIG. 10 includes the pn junction varactor 15 for the npn transistor 17 that turns ON or OFF in response to the Din signal. When the Din signal rises or falls, the pn junction varactor 15 exchanges charges with the npn transistor 17, thereby helping the npn transistor 17 change its states at a high speed. The circuit shown in FIG. 10 further includes the pn junction varactor 16 for the pnp transistor 18 that turns ON or OFF in response to the Din signal. When the Din signal rises or falls, the pn junction varactor 16 exchanges charges with the pnp transistor 18, thereby helping the pnp transistor 18 change its states at a high speed.

Figure 12:
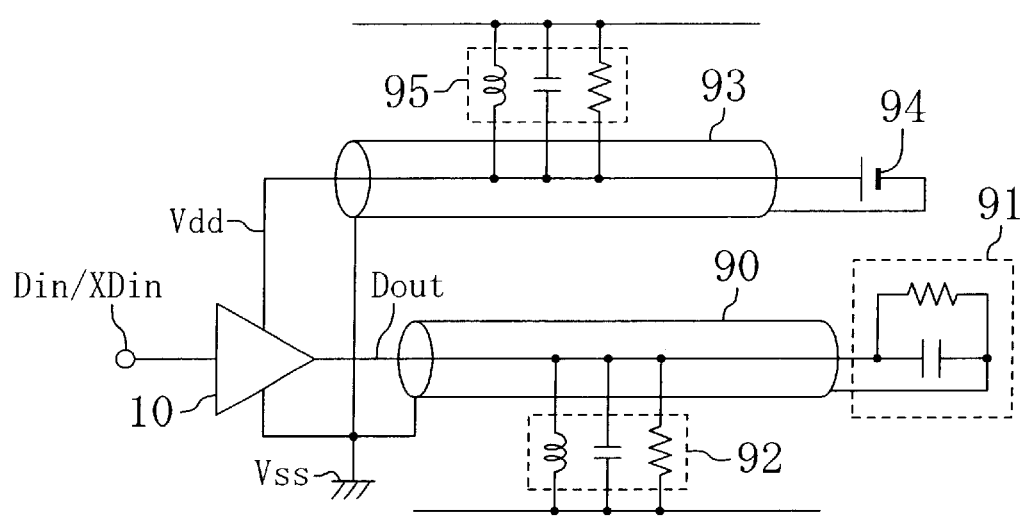
FIG. 12 illustrates how power is supplied in the inventive semiconductor integrated circuit and how good the drivability of the circuit is.

FIG. 12 illustrates how power is supplied in the inventive semiconductor integrated circuit and how good the drivability of the circuit is. In the example illustrated in FIG. 12, the line driver 10 shown in FIGS. 1, 4, 7 or 10 drives a signal line 90. A receiver load 91 is carried by the signal line 90. A loss is induced due to electromagnetic coupling between the signal line 90 and all adjacent lines as indicated by the reference numeral 92. Power supply Vdd and ground Vss for the driver 10 are connected to a power line 93. A power source 94 is also connected to the power line 93. A loss is also induced due to electromagnetic coupling between the power line 93 and all adjacent lines as indicated by the reference numeral 95. If a direct current is supplied from the power source 94, then no electromagnetic coupling should occur between the power line 93 and the adjacent lines and no loss should be induced. The same statement is applicable to the signal line 90. The driver 10 has only to transmit an energy (i.e., a charge quantity) great enough to drive the receiver load 91 within an allowable amount of time.

The lines 90 and 93 causing such losses are comparable to waterworks pipes with leakage. According to this comparison, the driver 10 may be regarded as a valve for those pipes. If part of the pipe just before the valve has thinned due to leakage compared to another part thereof beside the power source 94 but is still thicker than the pipe connecting the driver 10 to the receiver, then the required amount of water can be supplied from the driver 10 without causing any problems. So long as this relationship is maintained, no bypass capacitors are needed.

To invert the logical level of a capacitance that has been formed by the charges stored in a transistor, however, an instantaneous current is needed. Accordingly, using the power line 93 causing that loss, the power source 94 cannot supply required energy all the way to the driver 10 instantaneously. For that reason, in the known structure already mentioned, bypass capacitors are inserted into a part of the power line 93 so as to be located as close to the driver 10 as possible. In contrast, if compensation is made using the inventive varactors, there would no problem so long as the pipe thickness (i.e., characteristic impedance) of the power line 93 is smaller than that of the signal line 90. Unfortunately, though, the capacitive loss sometimes acts just like charges stored in a transistor. Accordingly, it is still necessary to reinforce the power-supplying pipe (i.e., power line) 93 by inserting bypass capacitors to various positions of the line 93.

Generally speaking, a logic or memory circuit often includes various additional circuits such as ringing eliminator (e.g., resistors inserted), pull-up or pull-down circuit, push-pull circuit, slew rate controller and PLL circuit. However, just by inserting the varactors of the present invention, all of these additional circuits can be eliminated advantageously. Thus, the increase in necessary chip area, resulting from the addition of those varactors, can be offset.

In addition, as can be easily seen from the cross-sectional views already referred to, the number of process steps required hardly increases, either. Naturally, the present invention is also effectively applicable to any non-complementary semiconductor integrated circuit so long as the circuit includes transistors, diodes, junction capacitances, channel-type resistances or channel-type capacitances. Furthermore, as is readily understandable from the principle of the present invention, this invention is also effectively applicable to any other type of compound transistors, not just to silicon transistors.

What is claimed is:

1. A semiconductor integrated circuit comprising:
    a p-channel MOS transistor having a source connected to a power supply, a gate for receiving an input signal, and a drain connected to an output;
    an n-channel MOS transistor having a source connected to a ground, a gate for receiving the input signal, and a drain connected to the output;
    a first MOS varactor having a drain and a source both connected to the source of the p-channel MOS transistor, and a gate for receiving an inverted signal of the input signal; and
    a second MOS varactor having a drain and a source both connected to the source of the n-channel MOS transistor, and a gate for receiving the inverted signal of the input signal.

2. The circuit of claim 1, wherein the first MOS varactor is a p-channel MOS varactor, and the second MOS varactor is an n-channel MOS varactor.

3. The circuit of claim 2, wherein the first MOS varactor is formed adjacent to the p-channel MOS transistor in an n-type region, and the second MOS varactor is formed adjacent to the n-channel MOS transistor in a p-type region.

4. The circuit of claim 1, wherein the first MOS varactor is an n-channel MOS varactor, and the second MOS varactor is a p-channel MOS varactor.

5. A semiconductor integrated circuit comprising:

a p-channel MOS transistor having a source connected to a power supply, a gate for receiving an input signal, and a drain connected to an output;

an n-channel MOS transistor having a source connected to a ground, a gate for receiving the input signal, and a drain connected to the output;

a first pn junction varactor interposed between the source and the gate of the p-channel MOS transistor; and a second pn junction varactor interposed between the source and the gate of the n-channel MOS transistor;

wherein the first pn junction varactor is a varactor of pnp-type, and the second pn junction varactor is a varactor of npn-type.

6. The circuit of claim 5, wherein the first pn junction varactor is formed adjacent to the p-channel MOS transistor in an n-type region, and the second pn junction varactor is formed adjacent to the n-channel MOS transistor in a p-type region.

7. A semiconductor integrated circuit comprising:

a first bipolar transistor having a collector connected to a power supply, a base for receiving an input signal, and an emitter connected to an output;

a second bipolar transistor of complementary type to the first bipolar transistor having a collector connected to a ground, a base for receiving the input signal, and an emitter connected to the output;

a first pn junction varactor interposed between the collector and the base of the first bipolar transistor; and a second pn junction varactor interposed between the collector and the base of the second bipolar transistor;

wherein the first bipolar transistor is an npn transistor, and the second bipolar transistor is a pnp transistor, and wherein the first pn junction varactor is a varactor of pnp-type, and the second pn junction varactor is a varactor of npn-type.

8. The circuit of claim 7, wherein the first pn junction varactor is formed adjacent to the first bipolar transistor in an n-type region, and the second pn junction varactor is formed adjacent to the second bipolar transistor in a p-type region.

* * * * *

UNITED STATES PATENT AND TRADEMARK OFFICE
CERTIFICATE OF CORRECTION

PATENT NO. : 6,731,153 B2
DATED : May 4, 2004
INVENTOR(S) : Kanji Otsuka et al.

It is certified that error appears in the above-identified patent and that said Letters Patent is hereby corrected as shown below:

Title page,
Item [73], Assignee please add -- Kanji Otsuka, Tokyo (JP); Tamotsu Usami, Tokyo (JP); Oki Electric Industry Co., Ltd., Tokyo (JP); Sanyo Electric Co., Ltd., Osaka (JP); Sharp Kabushiki Kaisha, Tokyo (JP); Hitachi, Ltd., Tokyo (JP); Fujitsu Limited, Kanagawa (JP); Mitsubishi Denki Kabushiki Kaisha, Tokyo (JP); Rohm Co., Ltd., Kyoto (JP) --

Signed and Sealed this

Thirty-first Day of August, 2004

JON W. DUDAS
*Director of the United States Patent and Trademark Office*

UNITED STATES PATENT AND TRADEMARK OFFICE
CERTIFICATE OF CORRECTION

PATENT NO. : 6,731,153 B2 Page 1 of 1
APPLICATION NO. : 09/963500
DATED : May 4, 2004
INVENTOR(S) : Kanji Otsuka et al.

It is certified that error appears in the above-identified patent and that said Letters Patent is hereby corrected as shown below:

<u>Title page</u>,
Item [73], Assignee please add -- Kanji Otsuka, Tokyo (JP); Tamotsu Usami, Tokyo (JP); Oki Electric Industry Co., Ltd., Tokyo (JP); Sanyo Electric Co., Ltd., Osaka (JP); Sharp Kabushiki Kaisha, Osaka (JP); Sony Corporation, Tokyo, (JP); Kabushiki Kaisha Toshiba, Tokyo, (JP); NEC Corporation, Tokyo, (JP); Hitachi, Ltd., Tokyo (JP); Fujitsu Limited, Kanagawa (JP); Mitsubishi Denki Kabushiki Kaisha, Tokyo (JP); Rohm Co., Ltd., Kyoto (JP) --

This certificate supersedes Certificate of Correction issued August 31, 2004.

Signed and Sealed this

Twenty-eighth Day of November, 2006

JON W. DUDAS
*Director of the United States Patent and Trademark Office*